*(12)* United States Patent
Matthews et al.

(10) Patent No.: US 6,885,714 B1
(45) Date of Patent: Apr. 26, 2005

(54) INDEPENDENTLY ROVING RANGE CONTROL

(75) Inventors: Joe P. Matthews, Savage, MN (US); Edward L. Grivna, Brooklyn Park, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 759 days.

(21) Appl. No.: 09/865,208

(22) Filed: May 24, 2001

(51) Int. Cl.$^7$ .............................................. H04L 7/00
(52) U.S. Cl. ............................................. 375/354
(58) Field of Search ................................ 375/354, 355, 375/364, 365, 377

(56) References Cited

U.S. PATENT DOCUMENTS

| | | | |
|---|---|---|---|
| 5,015,970 A | | 5/1991 | Williams et al. ............. 331/11 |
| 5,081,705 A | | 1/1992 | Swanke ...................... 455/73 |
| 5,249,206 A | * | 9/1993 | Appelbaum et al. ........ 375/356 |
| 5,692,022 A | * | 11/1997 | Haulin et al. ............... 375/357 |
| 5,952,888 A | | 9/1999 | Scott ............................. 331/2 |
| 6,003,118 A | * | 12/1999 | Chen .......................... 711/167 |
| 6,275,546 B1 | * | 8/2001 | Miller et al. ................ 375/354 |

OTHER PUBLICATIONS

Cypress Data Communications Data Book, CY7B951, "Local Area Network ATM Transceiver", 1996, pp. 3–1 to 3–8.

Cypress Data Communications Data Book, CY7B952, "Sonet/SDH Serial Transceiver", 1996, pp. 3–9 to 3–15.

Cypress Data Communicatons Data Book, CY7B923 CY7B933, "Transmitter/Receiver", 1996, pp. 4–1 to 4–27.

"Practical Data Communications" by Roger L. Freeman, 1995, pp. 130 to 286; John Wiley & Sons, Inc.

Cypress CY7C955, "AX™ ATM–Sonet/SDH Transceiver", Jul. 1997, pp. 2 to 76.

* cited by examiner

*Primary Examiner*—Young T. Tse
*Assistant Examiner*—Sam K. Ahn
(74) *Attorney, Agent, or Firm*—Christopher P. Maiorana, PC

(57) ABSTRACT

An apparatus comprising a first circuit, a second circuit, and a third circuit. The first circuit may be configured to generate a plurality of control signals and a select signal, in response to (i) a receive clock signal, (ii) a reference clock signal and (iii) a master clock signal. The second circuit may be configured to generate a read signal and a window signal in response to the plurality of control signals. The third circuit may be configured to generate a lock signal in response to (i) the reference clock signal, (ii) the select signal, (iii) the read signal and (iv) the window signal. The receive clock signal and the reference clock signal may be independent clocks configured to provide range control over one or more channels.

19 Claims, 3 Drawing Sheets

INDEPENDENTLY ROVING RANGE CONTROL

FIELD OF THE INVENTION

The present invention relates to a method and/or architecture for implementing independently roving range control generally and, more particularly, to a method and/or architecture for performing roving range control over multiple channels without a requirement for phase and/or frequency relationships between any of the clocks.

BACKGROUND OF THE INVENTION

Conventional range control circuits use dedicated range controls for each of a number of reference clocks. Additionally, a master clock must have the same phase and frequency as a particular reference clock at any given time. Therefore, conventional multiple channel range control devices do not offer completely independent operation.

It would be desirable to allow each of a number of channels to operate independently at a variety of different frequencies and/or phases.

SUMMARY OF THE INVENTION

The present invention concerns an apparatus comprising a first circuit, a second circuit, and a third circuit. The first circuit may be configured to generate a plurality of control signals and a select signal, in response to (i) a receive clock signal, (ii) a reference clock signal and (iii) a master clock signal. The second circuit may be configured to generate a read signal and a window signal in response to the plurality of control signals. The third circuit may be configured to generate a lock signal in response to (i) the reference clock signal, (ii) the select signal, (iii) the read signal and (iv) the window signal. The receive clock signal and the reference clock signal may be independent clock configured to provide range control over one or more channels.

The objects, features and advantages of the present invention include implementing a method and/or architecture for performing roving range control over multiple channels that may (i) not require phase and/or frequency relationships between any clock; (ii) operate with completely independent clocks; (iii) allow a single range control circuit; (iv) implement multiple channel applications that may be run at different frequencies; and/or (v) implement a master clock that may be one of the reference clocks and/or a separate system clock.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
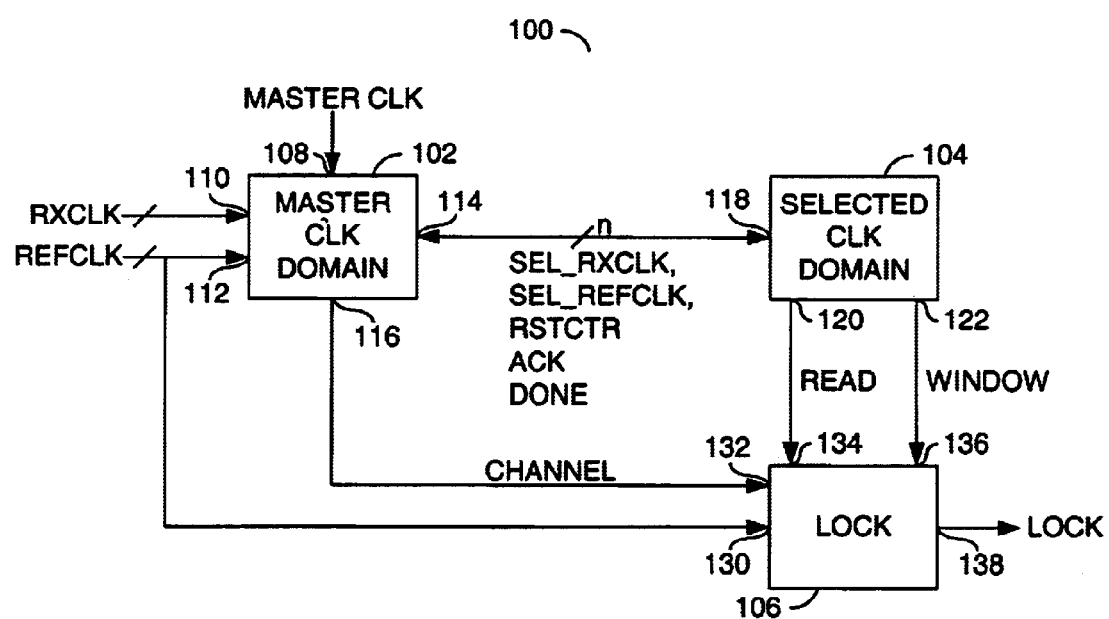
FIG. 1 is a block diagram of a preferred embodiment of the present invention.

Referring to FIG. 1, a block diagram of a circuit 100 is shown in accordance with a preferred embodiment of the present invention. The circuit 100 may be implemented as an architecture that may perform roving range control over multiple channels. Additionally, the circuit 100 may not require phase and/or frequency relationships of any clock (e.g., between a master clock and reference(s) clocks).

The circuit 100 may provide completely independent clocks without particular phase or frequency requirements on any clocks. The circuit 100 may be implemented for multiple channel applications that may be run at different frequencies. Additionally, a master clock may be one of the reference clocks or a separate system clock.

The circuit 100 may be implemented as a range control circuit for multiple channels with independent clocking. The circuit 100 may implement a single range control circuit. Specifically, the circuit 100 may provide proper operation for any combination of phase and frequency between the clocks. The circuit 100 may allow each channel to work independently at different frequencies and/or predetermined tolerances. Therefore, the circuit 100 may provide a frequency range control circuit for multiple channels with independent reference frequencies. Furthermore, the circuit 100 may operate with any combination of phase or frequency of any of the clocks used in a particular application circuit.

The circuit 100 generally comprises a circuit 102, a circuit 104 and a circuit 106. The circuit 102 may be implemented as a master clock domain circuit. The circuit 104 may be implemented as a selected clock domain circuit. The circuit 106 may be implemented as a lock circuit. The circuit 102 may have an input 108 that may receive a signal (e.g., MASTERCLK), an input 110 that may receive a signal (e.g., RXCLK), an input 112 that may receive a clock signal (e.g., REFCLK), an input/output 114 that may receive a number of signals from the circuit 104 (described below in connection with FIGS. 2 and 3) and an output 116 that may present a signal (e.g., CHANNEL). In one example, the signal CHANNEL may be implemented as a channel select signal. In one example, the signals RXCLK and REFCLK may be implemented as multi-bit (e.g, multiple clock) signals.

The circuit 104 may have an input/output 118 that may present the number of signals to the input/output 114 of the circuit 102, an output 120 that may present a signal (e.g., READ), and an output 122 that may present a signal (e.g., WINDOW). In one example, the signal READ may be implemented as a read pulse and the signal WINDOW may be implemented as a time window. The circuit 106 may have an input 130 that may receive the signal REFCLK, an input 132 that may receive the signal CHANNEL, an input 134 that may receive the signal READ, an input 136 that may receive the signal WINDOW and an output 138 that may present a signal (e.g., LOCK). The signal LOCK may indicate a lock between the frequencies (e.g., the signal RXCLK and the signal REFCLK).

The range control circuit 100 may compare two clock frequencies (e.g., the receive clock RXCLK or the reference clock REFCLK) and determine if the clock frequencies are within a specified tolerance. For example, in data communications point-to-point applications, a local reference clock may be compared to a recovered clock from an incoming serial bit stream. Additionally, integration of multiple channels (e.g., clock frequencies) on a single integrated circuit is advantageous.

Figure 2:
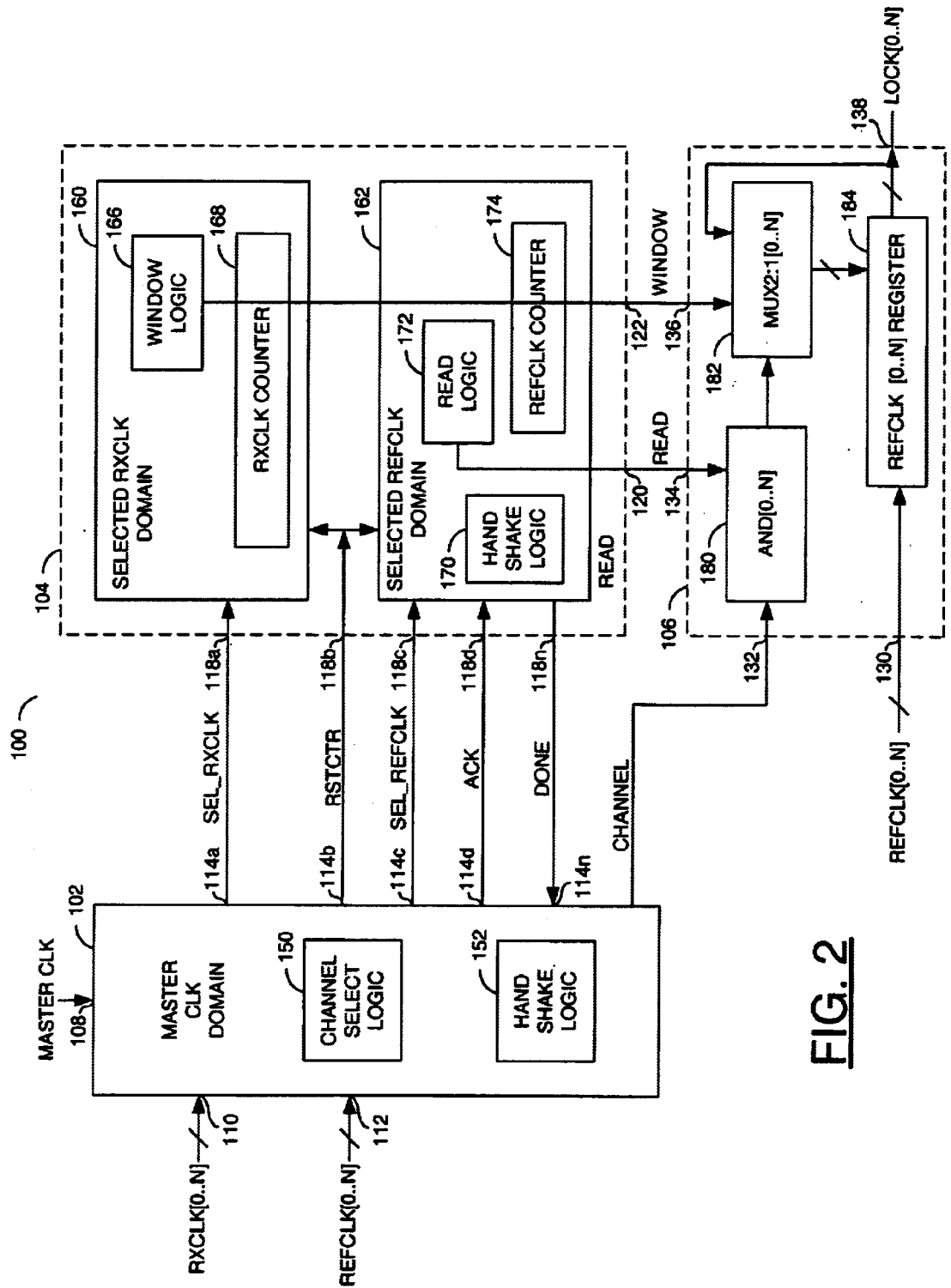
FIG. 2 is a detailed block diagram of the circuit of FIG. 1.

Referring to FIG. 2, a more detailed diagram of the circuit 100 is shown. The circuit 102 generally comprises a logic circuit 150 and a logic circuit 152. The logic circuit 150 may be implemented as a channel select logic circuit. The logic circuit 152 may be implemented as a handshake logic circuit. The circuit 104 generally comprises a domain circuit 160 and a domain circuit 162. In one example, the domain circuit 160 may be implemented as a selected receive clock domain circuit and the domain circuit 102 may be implemented as a selected reference clock domain circuit.

The circuit 160 generally comprises a logic circuit 166 and a counter circuit 168. In one example, the logic circuit 166 may be a window logic circuit and the counter circuit 168 may be a receive clock counter circuit. The circuit 162 generally comprises a logic circuit 170, a logic circuit 172 and a counter circuit 174. In one example, the logic circuit 170 may be implemented as a handshake logic circuit, the logic circuit 172 may be implemented as a read logic circuit and the counter circuit 174 may be implemented as a reference clock circuit.

The circuit 106 generally comprises a circuit 180, a circuit 182 and a circuit 184. The circuit 180 generally comprises an AND array. The circuit 182 generally comprises a multiplexer. The circuit 184 generally comprises a register circuit.

The circuit 100 may include two counters (e.g., the counters 168 and 174) that may be initially reset via a signal (e.g., RSTCTR) and then incremented at the clock rate of two clocks (e.g., a recovered clock RXCLK[n] and a reference clock REFCLK[n], where n is the channel selected). The timing window signal WINDOW may be generated at specific counts of the clock RXCLK and the read pulse READ may be generated at a specific count of the clock REFCLK (to be described in connection with FIG. 3). The timing window signal WINDOW and the READ pulse along with the select signal CHANNEL may be ANDed by the circuit 180 and stored in the register 184 by the clock REFCLK[n] of a particular channel n. The output of the register 184 may be the signal LOCK. The signal LOCK may be clocked by the signal REFCLK[n].

Figure 3:
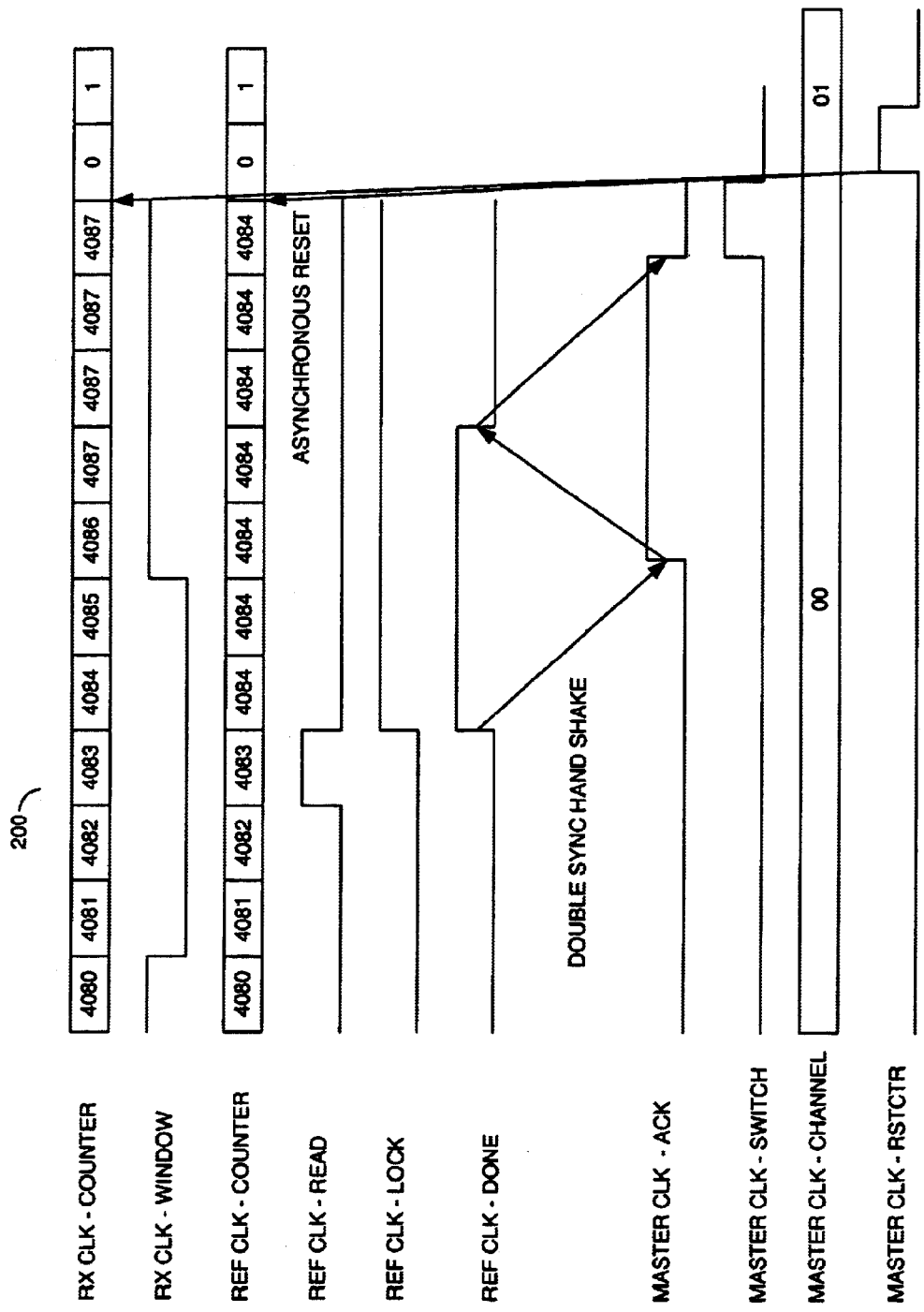
FIG. 3 is a timing diagram illustrating an operation of the present invention.

Referring to FIG. 3, a timing diagram 200 is shown illustrating an operation of the present invention. The LOCK condition may be updated at the read pulse READ. The read pulse READ may be followed by a double sync handshake of the selected RXCLK domain and the REFCLK domain. When the handshake is completed, a single master clock pulse MASTERCLK_SWITCH (internal to the circuit 150) may perform the switch incrementing of the select signal CHANNEL. The next master clock is the single cycle MASTERCLK_RSTCTR reset pulse which may be an asynchronous reset of the counters 168 and 174. The receive clock counter 168 may stop counting and hold a value after the timing window signal WINDOW ends. The reference clock counter 174 may stop after the read pulse READ. Halting the counter 168 and 174 may ensure that the counters 168 and 174 will not wrap around and create false reads. The process may then repeat for the next channel. The select signal CHANNEL may select the channels in a circular fashion (e.g., 0-1-2-3-0-1-2-3, etc.) Therefore, the circuit 100 may require a single frequency range control circuit. The architecture 100 generally provides operation with any combination of phase and/or frequencies of the clocks.

The signal DONE and the signal ACK may be double synchronized before the logic of the master clock domain 102 receives the next channel. The double synchronization may eliminate metastabilty in the circuit 100. The roving aspect of the circuit 100 may check each channel in a circular fashion. Therefore, a single range control circuit (e.g., the lock circuit 106) may be required for multiple channels. The counters 168 and 174 may select an appropriate clock (e.g., the signal SEL_RXCLK and the signal SEL_REFCLK) and commence counting at release of the asynchronous reset RSTCTR presented by the master clock domain 102. The signal WINDOW may go active between specific counts of the counter 168 (e.g., in response to the signal RXCLK_COUNTER). A window size of the signal WINDOW may be the addition of two times the acceptable range defined by the system requirements and one clock of uncertainty.

In the selected reference clock domain 162, the read pulse READ may be generated at the center count of the signal WINDOW. In one example, the count WINDOW may be from 4081 to 4085 and the read pulse READ may be at 4083. The read pulse READ along with the signal WINDOW and the select signal CHANNEL may go through the AND circuit 180 and be registered in the reference clock domain of the selected channel to provide the signal REFCLK_LOCK. The signal DONE may follow the read pulse READ and be held until a double synchronous version of the signal ACK is active. The signal ACK may go active from the acknowledgment of a double synchronous version of the signal DONE. The signal ACK may be held until the signal DONE goes inactive. Such an implementation may provide a double synchronous handshake, which may remove potential metastabilty events. Once the handshake is complete, the select signal CHANNEL may be incremented and followed by the reset pulse RSTCTR to the counters 168 and 174. The sequence may be repeated for each newly selected channel.

The circuit 100 may allow a single range control circuit to be implemented for multiple channels without phase and frequency requirements between the clocks. The circuit 100 may be applicable to multiple channel point-to-point communications devices. Alternatively, the circuit 100 may use a master clock which has no requirement of phase or frequency.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate a plurality of control signals and a select signal, in response to (i) a receive clock signal, (ii) a reference clock signal and (iii) a master clock signal;
    a second circuit configured to generate a read signal and a window signal in response to said plurality of control signals; and
    a third circuit configured to generate a lock signal in response to (i) said reference clock signal; (ii) said select signal; (iii) said read signal and (iv) said window signal, wherein said receive clock signal and said reference clock signal are independent clocks configured to provide range control over one or more channels.

2. The apparatus according to claim 1, wherein said apparatus is configured to provide proper operation for any combination of phase and frequency of said receive clock signal and said reference clock signal.

3. The apparatus according to claim 1, wherein said receive clock signal comprises a plurality of receive clock signals and said reference clock signal comprises a plurality of reference clock signals.

4. The apparatus according to claim 3, wherein said master clock signal comprises at least one of said plurality of reference clock signals.

5. The apparatus according to claim 1, wherein said third circuit is configured to determine if said receive clock signal and said reference clock signal are within a predetermined tolerance.

6. The apparatus according to claim 1, wherein said third circuit comprises a lock circuit.

7. The apparatus according to claim 1, wherein said second circuit is configured to perform a double synchronization handshake to eliminate metastability.

8. The apparatus according to claim 1, wherein said second circuit is configured to perform an asynchronous reset to prevent false reads.

9. The apparatus according to claim 1, wherein:

said first circuit comprises a master clock domain circuit configured to select (i) a channel and (ii) said receive clock signal and said reference clock signal for said channel, wherein said first circuit generates a reset signal and increments a channel select after acknowledgment that a lock decision for the selected channel has been completed;

said second circuit comprises a selected clock domain circuit configured to (i) receive said reset signal, (ii) present said read signal in a selected reference clock domain at a specific count and (iii) activate said window signal between two counts in a selected receive clock domain; and said third circuit comprises a lock circuit configured to update the channel select of the clock signal in response to said read signal, said window signal and said channel signal.

10. The apparatus according to claim 9, wherein:

said master clock domain circuit comprises a channel select circuit configured to generate said select signal and a hand shake circuit configured to generate one or more of said plurality of control signals;

said selected clock domain circuit comprises one or more counters and one or more logic circuits configured to generate said read signal and said window signal; and said lock circuit comprises one or more logic circuits and a register configured to present said lock signal.

11. The apparatus according to claim 9, wherein said selected clock domain circuit comprises:

a selected receive clock domain circuit configured to generate said window signal; and a selected reference clock domain circuit configured to generate said read signal.

12. An apparatus comprising:

means for generating a plurality of control signals and a select signal, in response to (i) a receive clock signal, (ii) a reference clock signal and (iii) a master clock signal;

means for generating a read signal and a window signal in response to said plurality of control signals; and means for generating a lock signal in response to (i) said reference clock signal; (ii) said select signal; (iii) said read signal and (iv) said window signal, wherein said lock signal provides independent range control between one or more channels of said receive clock signal and said reference clock signal.

13. A method for providing independent roving range control, comprising the steps of:

(A) generating a plurality of control signals and a select signal, in response to (i) a receive clock signal, (ii) a reference clock signal and (iii) a master clock signal;

(B) generating a read signal and a window signal in response to said plurality of control signals; and (C) generating a lock signal in response to (i) said reference clock signal; (ii) said select signal; (iii) said read signal and (iv) said window signal, wherein said lock signal provides said independent roving range control between one or more channels of said receive clock signal and said reference clock signal.

14. The method according to claim 13 wherein said method provides proper operation for any combination of phase and frequency of said receive clock signal and said reference clock signal.

15. The method according to claim 13, wherein said receive clock signal comprises a plurality of receive clock signals and said reference clock signal comprises a plurality of reference clock signals.

16. The method according to claim 15, wherein said master clock signal comprises at least one of said plurality of reference clock signals.

17. The method according to claim 13, wherein step (C) further comprises:

generating said lock signal by determining if said receive clock signal and said reference clock signal are within a predetermined tolerance.

18. The method according to claim 13, wherein step (B) further comprises:

performing a double synchronization handshake to eliminate metastability.

19. The method according to claim 13, wherein step (B) further comprises:

performing an asynchronous reset to prevent false reads.

* * * * *